(12) United States Patent
Higgins

(10) Patent No.: US 9,229,042 B2
(45) Date of Patent: Jan. 5, 2016

(54) PARTIAL DISCHARGE MONITORING METHOD AND SYSTEM

(75) Inventor: Simon Higgins, Johannesburg (ZA)

(73) Assignee: Eskom Holdings SOC Limited, Johannesburg (ZA)

( * ) Notice: Subject to any disclaimer, the term of this patent is extended or adjusted under 35 U.S.C. 154(b) by 824 days.

(21) Appl. No.: 13/057,712

(22) PCT Filed: Jul. 22, 2009

(86) PCT No.: PCT/IB2009/053174
§ 371 (c)(1),
(2), (4) Date: Jun. 23, 2011

(87) PCT Pub. No.: WO2010/015958
PCT Pub. Date: Feb. 11, 2010

(65) Prior Publication Data
US 2011/0248721 A1    Oct. 13, 2011

(30) Foreign Application Priority Data

Aug. 6, 2008 (ZA) .................................. 2008/06804

(51) Int. Cl.
*G01R 31/02* (2006.01)
*G01R 31/12* (2006.01)
*G01R 1/00* (2006.01)
(Continued)

(52) U.S. Cl.
CPC .............. *G01R 31/1272* (2013.01); *G01R 1/00* (2013.01); *H01B 1/00* (2013.01); *H01L 21/00* (2013.01); *H01L 2221/00* (2013.01); *H02B 1/00* (2013.01); *H02J 1/00* (2013.01)

(58) Field of Classification Search
CPC ...... G01R 1/00; H01L 21/00; H01L 2221/00; H01B 1/00; H02J 1/00; H02B 1/00
USPC .......... 324/405–413, 420, 509–513, 520–537
See application file for complete search history.

(56) References Cited

U.S. PATENT DOCUMENTS 5,146,170 A * 9/1992 Ishikawa et al. ............... 324/536
5,200,737 A * 4/1993 Konishi et al. ................. 340/644

(Continued)

FOREIGN PATENT DOCUMENTS

| JP | 7-12880 | 1/1995 |
| JP | 7-159477 | 6/1995 |
| JP | 8-105928 | 4/1996 |

OTHER PUBLICATIONS

International Search Report for Application No. PCT/IB2009/053174, dated Dec. 8, 2009.

*Primary Examiner* — Huy Q Phan
*Assistant Examiner* — Temilade Rhodes-Vivour
(74) *Attorney, Agent, or Firm* — Nelson Mullins Riley & Scarborough LLP; Anthony A. Laurentano

(57) ABSTRACT

The invention relates to a method and system of monitoring partial discharges occurring in an electrical system, and to a method of measuring or analyzing partial discharges occurring in an electrical system. The method comprising receiving a signal or impulse, or information associated therewith, from the electrical system; breaking the received signal or impulse into predefined frequency components; and displaying a peak of the received signal or impulse on a scatter plot with other peaks associated with similar predefined frequency components.

12 Claims, 16 Drawing Sheets

(51) Int. Cl.
 *H01L 21/00* (2006.01)
 *H01B 1/00* (2006.01)
 *H02J 1/00* (2006.01)
 *H02B 1/00* (2006.01)

(56) References Cited

U.S. PATENT DOCUMENTS

| | | | |
|---|---|---|---|
| 5,214,595 A * | 5/1993 | Ozawa et al. | 702/58 |
| 5,253,180 A * | 10/1993 | Yamagiwa et al. | 702/59 |
| 5,256,976 A * | 10/1993 | Ishikawa et al. | 324/522 |
| 5,272,439 A * | 12/1993 | Mashikian et al. | 324/520 |
| 5,570,028 A * | 10/1996 | Sperlazzo et al. | 324/528 |
| 5,578,931 A * | 11/1996 | Russell et al. | 324/536 |
| 5,929,642 A * | 7/1999 | Philippot et al. | 324/522 |
| 5,982,181 A | 11/1999 | Rokunohe et al. | |
| 6,291,979 B1 * | 9/2001 | Soma et al. | 324/76.82 |
| 6,369,582 B2 * | 4/2002 | Coffeen | 324/547 |
| 6,377,184 B1 * | 4/2002 | Minker | 340/635 |
| 6,420,863 B1 * | 7/2002 | Milde et al. | 324/76.76 |
| 6,809,523 B1 * | 10/2004 | Ahmed et al. | 324/520 |
| 6,917,888 B2 * | 7/2005 | Logvinov et al. | 702/59 |
| 6,930,610 B2 * | 8/2005 | Gao et al. | 340/635 |
| 7,579,843 B2 * | 8/2009 | Younsi et al. | 324/458 |
| 7,676,333 B2 * | 3/2010 | Younsi et al. | 702/58 |
| 7,750,646 B2 * | 7/2010 | Maity et al. | 324/536 |
| 8,143,899 B2 * | 3/2012 | Younsi et al. | 324/523 |
| 2004/0246000 A1 * | 12/2004 | Kuppuswamy | 324/536 |
| 2007/0085548 A1 * | 4/2007 | Shinmoto | G01R 31/1272 324/508 |
| 2007/0139056 A1 * | 6/2007 | Kaneiwa | G01R 31/1227 324/536 |
| 2008/0048710 A1 * | 2/2008 | Cern | G01R 31/1272 324/536 |
| 2008/0061997 A1 * | 3/2008 | Miyashita et al. | 340/646 |

* cited by examiner

Pulse generated from the Phase 1a side

Pulse from Phase 1a

Pulse from Phase 1b 
T1

Pulse generated from the Phase 1b side

Pulse from Phase 1a

Pulse from Phase 1b 
T1

Scatter plot 1 for frequency spectra 1

Normalised frequency spectra 1

Scatter plot 2 for frequency spectra 2

Normalised frequency spectra 2

Scatter plot 5 for frequency spectra 5

Normalised frequency spectra 5

PARTIAL DISCHARGE MONITORING METHOD AND SYSTEM

RELATED APPLICATIONS

This application is a 35 U.S.C. 371 national stage filing of International Application No. PCT/IB2009/053174, filed Jul. 22, 2009 which claims priority to South African Patent Application No. 2008/06804 filed on Aug. 6, 2008 in South Africa. The content of the aforementioned application are hereby incorporated by reference.

BACKGROUND OF THE INVENTION

THIS invention relates to a method and system of monitoring partial discharges occurring in an electrical system, and to a method of measuring or analyzing partial discharges occurring in an electrical system.

The insulation of high voltage, typically three phase, electrical or power systems are often susceptible to impulses which occur therein. These impulses are typically due to discharges across inhomogeneous boundaries within the high voltage electrical or power system, such as gaps in insulation of cables, or the like. It will be appreciated that these discharges are often partial discharges within the high voltage electrical or power systems.

It is therefore an object of the present invention at least to provide a method and a system to monitor or detect partial discharges occurring in high voltage three phase electrical or power systems.

SUMMARY OF THE INVENTION

According to a first aspect of the invention there is provided a method of monitoring partial discharges occurring in an electrical system, the method comprising:
  receiving a signal or impulse, or information associated therewith, from the electrical system;
  breaking the received signal or impulse into predefined frequency components;
  discriminating noise or duplicated signals from the received signal or impulse; and
  displaying a peak of the received signal or impulse together with other peaks associated with similar predefined frequency components on a scatter plot.

The method may comprise generating a scratchpad to store a predefined number of normalised spectra for different signals or impulses together with peak values associated with the signals or impulses.

The method may comprise:
  storing a plurality of fault spectra in a database;
  monitoring the electrical system to receive signals or impulses occurring in the electrical system; and
  comparing, once a signal or impulse is received, a frequency spectrum associated with the detected signal or impulse with the plurality of fault spectra stored in the scratchpad or the database at least to determine if the frequency spectrum of the detected signal or impulse substantially matches any of the stored plurality of fault spectra.

The method may further comprise grouping fault spectra that, within a predefined limit, that have similar frequency content.

The method also comprises raising a suitable flag if a frequency spectrum of the detected impulse substantially matches any of the existing fault spectra.

Raising the flag may comprise generating a fault descriptor. Instead, or in addition, the flag may be a fault descriptor.

The method may comprise, in addition to raising a flag, storing data or the frequency spectrum associated with the received signal or impulse in the database if the frequency spectrum of the detected impulse does not substantially match any of the existing fault spectra.

The method may comprise generating scatter plots from a sub-set of the fault spectra of the received signal or impulse.

The method may comprise performing signal processing on the received signal or impulse.

The method may further comprise:
  generating a frequency spectrum of the received signal or impulse; and
  breaking the generated frequency spectrum into predefined frequency components.

Comparing the frequency spectrum associated with the detected or received signal or impulse with the existing fault spectra stored in the database may be done by way of a fault matching algorithm.

The method may advantageously comprise:
  validating the received signal or impulse;
  determining the peak value of the received signal or impulse; and
  normalising the peak values of each of the predefined frequency components of the detected impulse to a maximum level.

According to a second aspect of the invention, there is provided a system, for monitoring partial discharges occurring in an electrical system, the system comprising:
  a database for storing a plurality of fault spectra;
  a monitoring module for monitoring the electrical system to receive signals or impulses, or information associated therewith, occurring in the electrical system; and
  a comparator operable, once a signal or impulse is received, to compare a frequency spectrum associated with the received signal or impulse with the existing fault spectra stored in the database at least to determine if the frequency spectrum of the received signal or impulse substantially matches any of the existing fault spectra.

The system may be arranged to raise a flag if a frequency spectrum of the received signal or impulse substantially matches any of the existing fault spectra.

The system may be arranged to store data or the frequency spectrum associated with the received signal or impulse in the database.

The system may comprise a data generating module operable to generate data associated with the received signal or impulse.

The data generating module may be configured to generate scatter plots from a sub-set of the fault spectra of the received signal or impulse.

The monitoring module may be in communication with a plurality of sensors, the sensors being arranged to monitor each phase of the electrical or power system.

The system may comprise a frequency spectrum generating module operable to generate a frequency spectrum of the signal or impulse received by the monitoring module.

The comparator may be arranged to apply a fault matching algorithm to compare the frequency spectrum associated with the received signal or impulse with the existing fault spectra stored in the database.

The system may further comprise:
  a validation module arranged to validate the received signal or impulse;

a peak detector to determine the peak value of the received signal or impulse; and a normalising module arranged to normalise the peak values of each of the predefined frequency components of the received signal or impulse to a maximum level.

According a third aspect of the invention, there is provided a method of measuring or analyzing partial discharges occurring in an electrical system, the method including storing a plurality of fault spectra in a database;

monitoring the system to detect impulses occurring therein; and once an impulse is detected, comparing a frequency spectrum associated with the detected impulse with the plurality of fault spectra stored in the database to at least determine if the frequency spectrum of the detected impulse substantially matches any of the stored plurality of fault spectra.

DESCRIPTION OF PREFERRED EMBODIMENTS

In the following description, for purposes of explanation, numerous specific details are set forth in order to provide a thorough understanding of an embodiment of the present disclosure. It will be evident, however, to one skilled in the art that the present disclosure may be practiced without these specific details.

Figure 1:
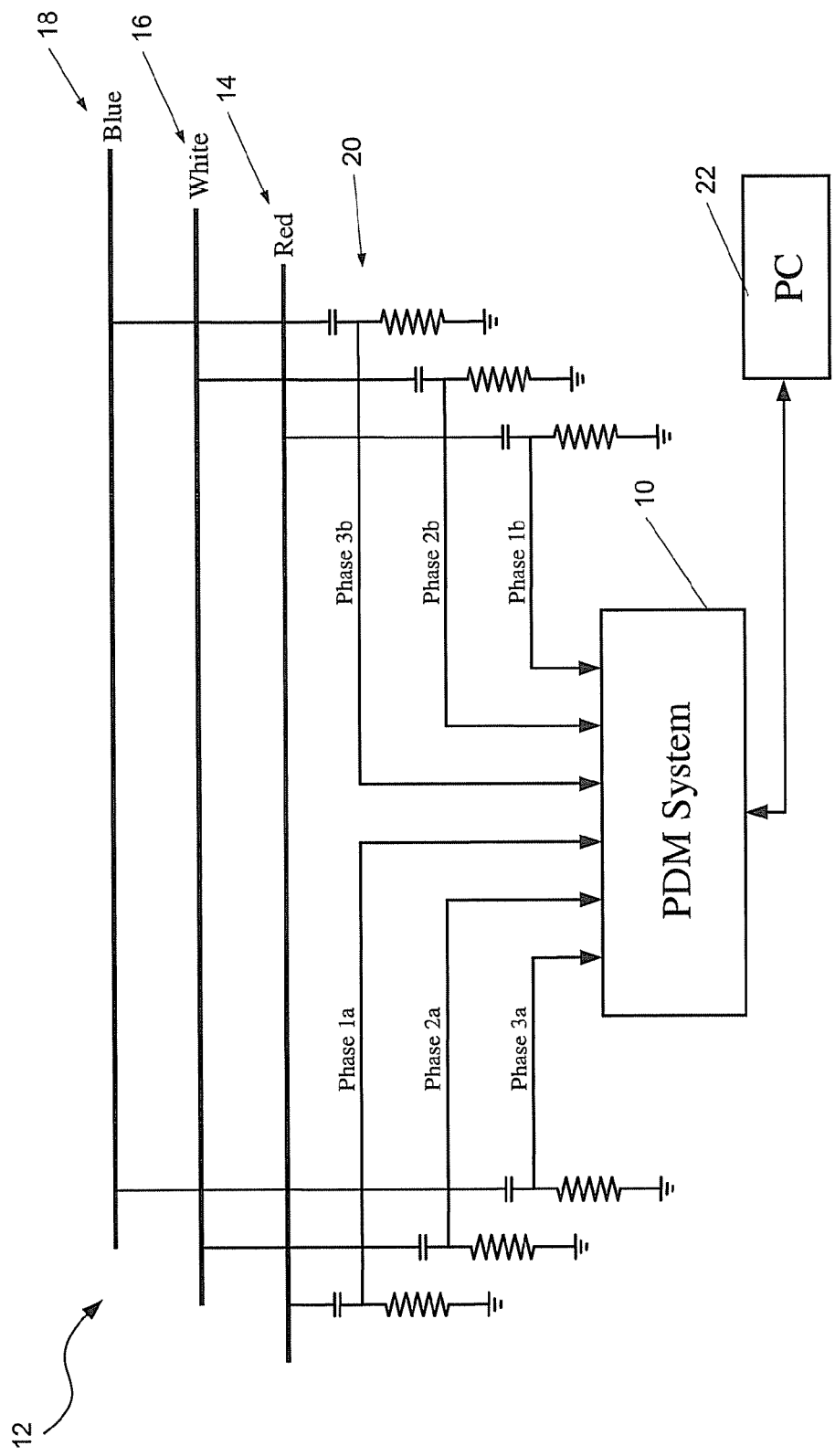
FIG. 1 shows a schematic interface diagram of a partial discharge monitoring (PDM) system, in accordance with an example embodiment, interfacing with a high voltage three-phase electrical or power system.
Figure 2:
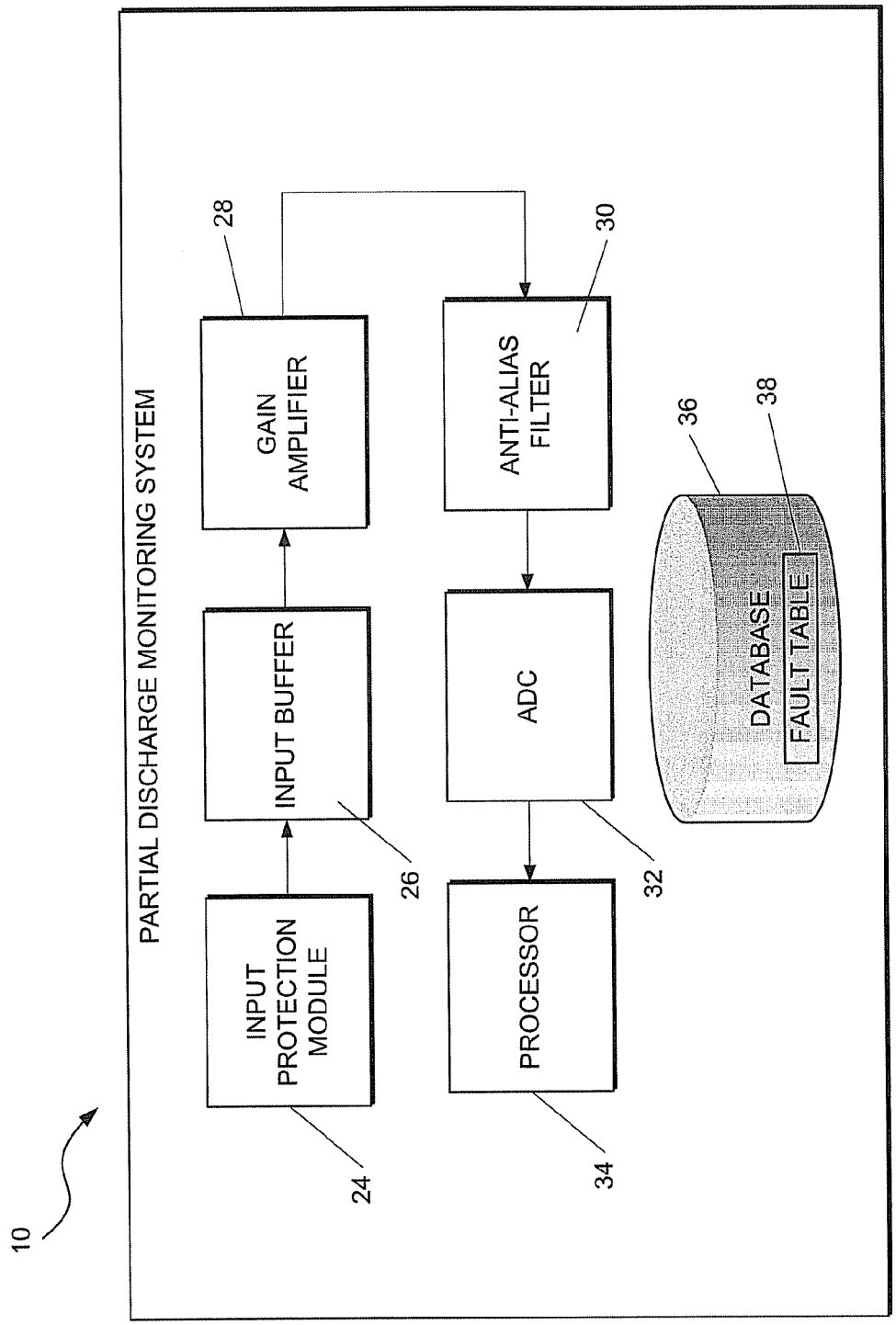
FIG. 2 shows a functional block diagram of the PDM system of FIG. 1 in greater detail.
Figure 3:
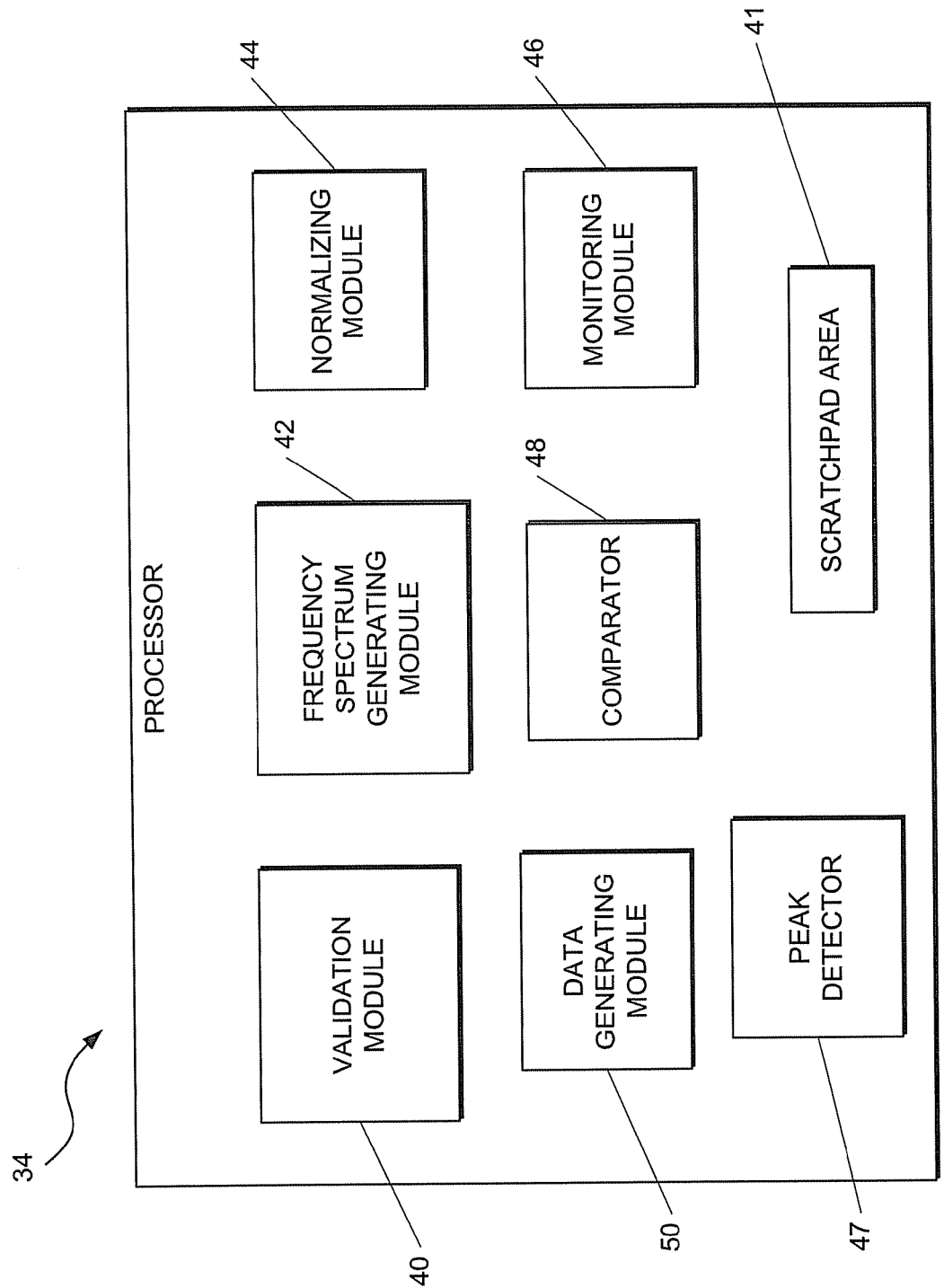
FIG. 3 shows a functional block diagram of a processor of the PDM of FIG. 2 in greater detail.

Referring to FIGS. 1 to 3 of the drawings, a partial discharge monitoring (PDM) system in accordance with an example embodiment is generally indicated by reference numeral 10. The PDM system 10 is communicatively coupled to a high voltage electrical or power distribution system 12, for example a three-phase power supply distribution system, via sensors 20. Each sensor 20 is typically in the form of a capacitor and a resistor to ground, or in other words a single pole high pass filter. In an example embodiment, a pair of sensors 20 is provided for each phase 14, 16 and 18 of the three-phase power system 12 such that there are six input channels to the PDM system 10. The pair of sensors 20 on a single phase 14, 16 or 18 can be used to determine the direction of travel of an event on that phase 14, 16 or 18 as will be described in greater detail below.

The PDM system 10 is also linked to a host computer 22, the physical layer of the link optionally using USB2 . In this regard, the PDM system 22 may be capable of operating in a stand-alone mode i.e. no computer 22 connected however when a computer 22 is subsequently connected to the PDM system 10, data may be transferred between the computer 22 and the PDM system 10 as desired. In an example embodiment PDM system 10 is linked to the host computer 22 when it is powered up in order to set up registers if the default values need changing and also to enable the host computer 22 to start the data acquisition. However, it will be noted that once the PDM system 10 is operating, it will continue to operate as if the host computer 22 is powered down. Subsequently when the host computer 22 is reconnected then a control module (not shown) provided on the host computer 22 will be refreshed with any requisite data from the PDM system 10.

It will be noted that the PDM system 10 is typically synchronized to the zero crossing of the mains.

In an example embodiment, the PDM system 10 comprises a plurality of components or modules which correspond to the functional tasks to be performed by the PDM system 10. In this regard, "module" in the context of the specification will be understood to include an identifiable portion of code, computational or executable instructions, data, or computational object to achieve a particular function, operation, processing, or procedure.

It follows that a module need not be implemented in software; a module may be implemented in software, hardware, or a combination of software and hardware. Further, the modules need not necessarily be consolidated into one device but may be spread across a plurality of devices.

In particular, the PDM system 10 includes an input protection module 24 to provide overvoltage and overcurrent protection for each channel. In an example embodiment, the PDM system 10 includes an input buffer 26. The input buffer 26 is typically in the form of a high-impedance analogue buffer with impedance greater that 1MΩ.

A gain amplifier 28, typically a programmable gain amplifier is also provided in the PDM system 10. The programmable gain amplifier 28 generally has a bandwidth of 270 MHz. It will be appreciated that once the PDM system 10 is powered up, the gains for all the sensors 20 will be set to minimum sensitivity.

The PDM system 10 further includes an anti-alias filter 30 with a cut-off frequency of about 270 MHz, a passband ripple of 0.5 dB and a stopband attenuation of 54 dB.

In an example embodiment, the PDM system 10 includes an 8-bit analogue to digital converter (ADC) 32 with a sampling frequency of 800 MHz.

Figure 16:
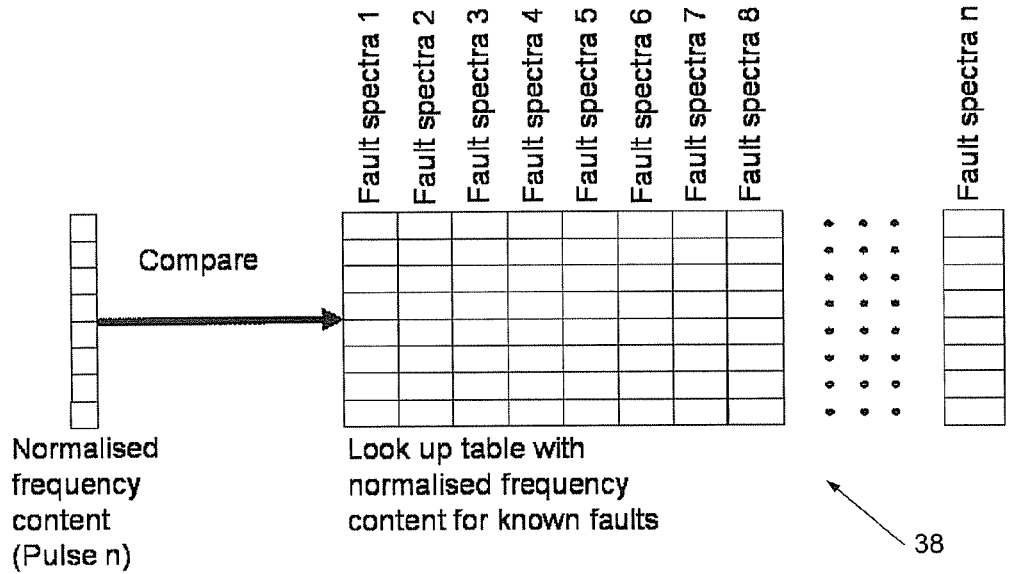
FIG. 16 shows an illustration of a look-up table in accordance with an example embodiment.

Referring also to FIG. 16 of the drawings, the PDM system 10 includes a database 36, within which at least a plurality of fault spectra is storable therein. In an example embodiment, the database 36 includes a look-up table of fault spectra or fault spectra table 38 (FIG. 16) which information of a plurality of fault spectra is storable therein. The look-up table 38 is defined for both known faults and noise. The look up table 38 is expandable, both with predefined fault spectra and fault spectra that the system 10 learns. In an example embodiment, each spectral component stored in the fault table 38 may comprise ten bits, in particular a sign bit, a single bit to allow the value 1.0 to be stored and an 8 bit mantissa: this will allow the storage of numbers in the range −0.99549375 to 1.00000000. A No Faults entry may be provided and limited to a maximum of $2^{16}-1$, i.e. 2 bytes. Thus each row in the fault table 38 will consist of 100 bits. It will be appreciated that the fault table 38 may be arranged such that read and write accesses can take place concurrently. However, in the situation were a read and write access takes place to the same location, the read access shall take priority.

The PDM system 10 also includes a processor 34 (shown in greater detail in FIG. 3) to carry out further functional, in particular signal processing tasks, to be performed by the PDM system 10. In this regard, it will be appreciated that the processor 34 may also include a plurality of functional modules corresponding to the functions which the processor 34 is to perform. It follows from the discussion regarding modules above that the modules or in particular the functionality of the modules of the processor 34 need not be provided solely within the processor 34 but may be optionally provided within the PDM system 10. In an example embodiment, the processor 34 is in the form of a field programmable gate array (FPGA).

It will be appreciated that the processor 34 considers data in terms of time frames, in particular three time frames namely a time slice, a minor time frame, and a major time frame. A time slice is typically a 80 μs time frame. The time slice is the resolution for the time axis in multi-dimensional arrays used to store collected data. The minor time frame is typically a 20 ms (equivalent to one cycle at 50 Hz). It follows that a minor time frame consists of 250 time slices. The major time frame is the period over which data is aggregated and is typically made up of a user defined or programmable number of minor time frames. For example, a major time frame may comprise a minimum of one minor time frame and may comprise a maximum of 500 minor time frames.

Figure 12:
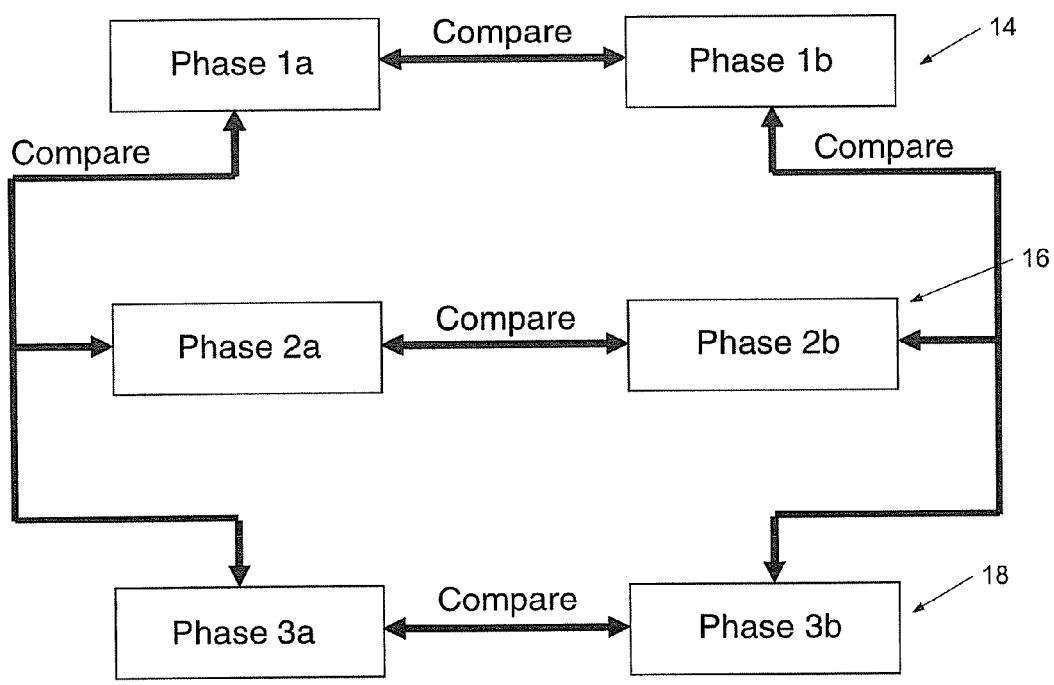
FIG. 12 shows a functional block diagram for pulse discrimination of an input impulse.

Returning to FIG. 3, the processor 34 includes a validation module 40. In other example embodiments, the validation module 40 is separate from the processor 34. The validation module 40 is operable to carry out pulse validation of an input signal. The validation module 40 is therefore operable to compare phases 14, 16, and 18 as indicated in FIG. 12. In particular, the validation module 40 is operable to perform three processes which are required to validate an input impulse or pulse as part of a validation process. Typically, these processes are to determine the direction of travel of a received input impulse, noise discrimination, and cross-coupling validation. The latter two processes are undertaken after the direction of travel of the input is determined and the input which arrives first is used in the latter two processes. Also, for the latter two processes, the validation module 40 is arranged to compare phases 1a, 2a, and 3a (and similarly phases 1b, 2b, and 3b) as illustrated in FIG. 12. The PDM system 10 optionally includes a noise discrimination module (not shown) to perform or to assist the validation module 40 to perform the noise discrimination as herein described. It follows that for detecting or determining the direction of travel of a pulse the validation module 40 is arranged to compare phases 1a with 1b, 2a with 2b, and 3a with 3b.

Figure 14:
FIG. 14 shows a graphical representation of timing associated with pulses from either the phases 1a and 1b as illustrated in FIG. 1.
Figure 14:
Figure 14:
Figure 14:
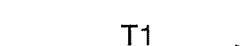

To determine the direction of travel, it will be understood that the validation module 40 is arranged to measure the time of arrival of an input impulse signal at both sensors 20 for each phase 14, 16, and 18. If the travel time is less than a programmed transit time, $T_{tr}$, then the validation module 40 ignores the impulse. However, if the travel time is greater than the programmed transit time $T_{tr}$, then the validation module 40 determines which sensor 20 the impulse arrived at first and a flag will be set or reset to indicate which direction the impulse arrived from. For example:

Flag 0: from sensor a;

Flag 1: from sensor b (as illustrated in FIG. 14, where $T_{tr}=T1$).

Figure 11:
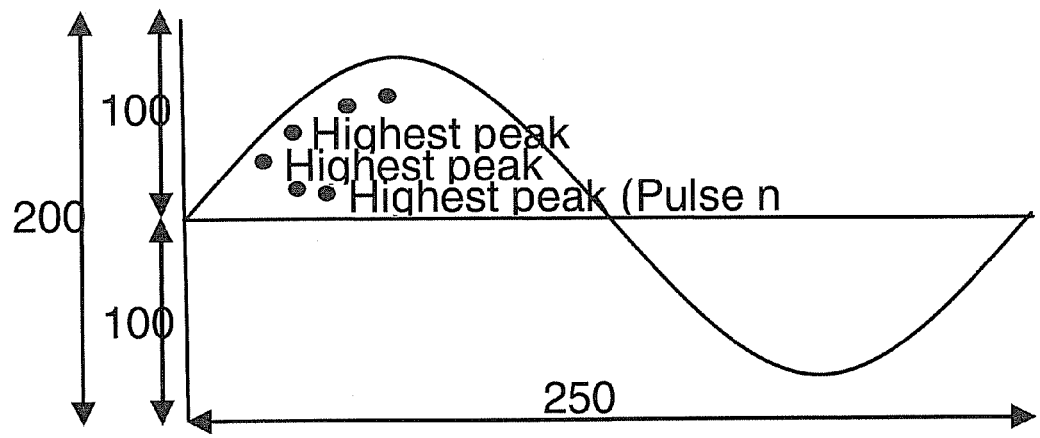
FIG. 11 shows an example illustration of a scatter plot generated by the PDM system of FIG. 2.

The flag can be used to determine which group of sixteen plots (generator or line) is to be updated. In this regard the processor 34 includes a data generating module 50 arranged to update or generate the plots, which may in an example embodiment be scatter plots, or the like. It will be noted that the data generating module 50 is operable to generate data associated with the received or detected impulse, the data may be used to create scatter plots, from a sub-set of the fault spectra of the received or detected impulse (discussed below). An example illustration of a scatter plot generated by the data generating module 50 (for all recorded pulses) is illustrated in FIG. 11.

The data generating module 50 is arranged to generate a single scatter plot illustrating all detected pulses in their associated time slice. Generated scatter plots are stored in the database 36 and scatter plots corresponding to faults are associated with the corresponding faults in the database 36.

It follows that the transit time may be selected within certain limits, particularly a minimum transit time, $T_{trmin}$ may be 10 ns whereas a maximum transit time, $T_{trmax}$ may be 250 ns.

Regarding determining the direction of travel, it will be noted that a sensor 20 is provided on each side phase 1a and 1b, phase 2a and 2b, and phase 3a and 3b of the phases 14, 16 and 18 respectively. FIG. 14 illustrates phase 14 with its respective sides phase 1a and phase 1b, if an impulse with similar spectral content and within a set period for example T1 is detected by sensor 20 at phase 1a first, the impulse therefore came from the phase 1a side. The impulse from the phase 1a side is stored or retained and the impulse from phase 1b is discarded. If however, an impulse with similar spectral content and within a set period T1 is detected at phase 1b first, the impulse therefore came from phase 1b side and the impulse from phase 1b is stored or retained while the impulse from phase 1a is discarded. As hereinbefore described, if the impulses occur in a time less than the set period T1 then they come from between detection points and they are accordingly discarded, the period T1 is therefore the period $T_{tr}$ as previously described.

Figure 6:
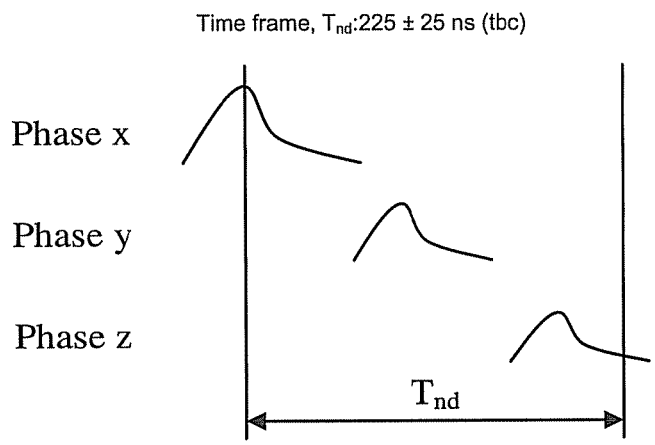
FIG. 6 shows a graphical representation of pulses occurring within a time frame, typically for illustrating noise discrimination characteristics of the PDM system as hereinbefore described.
Figure 13:
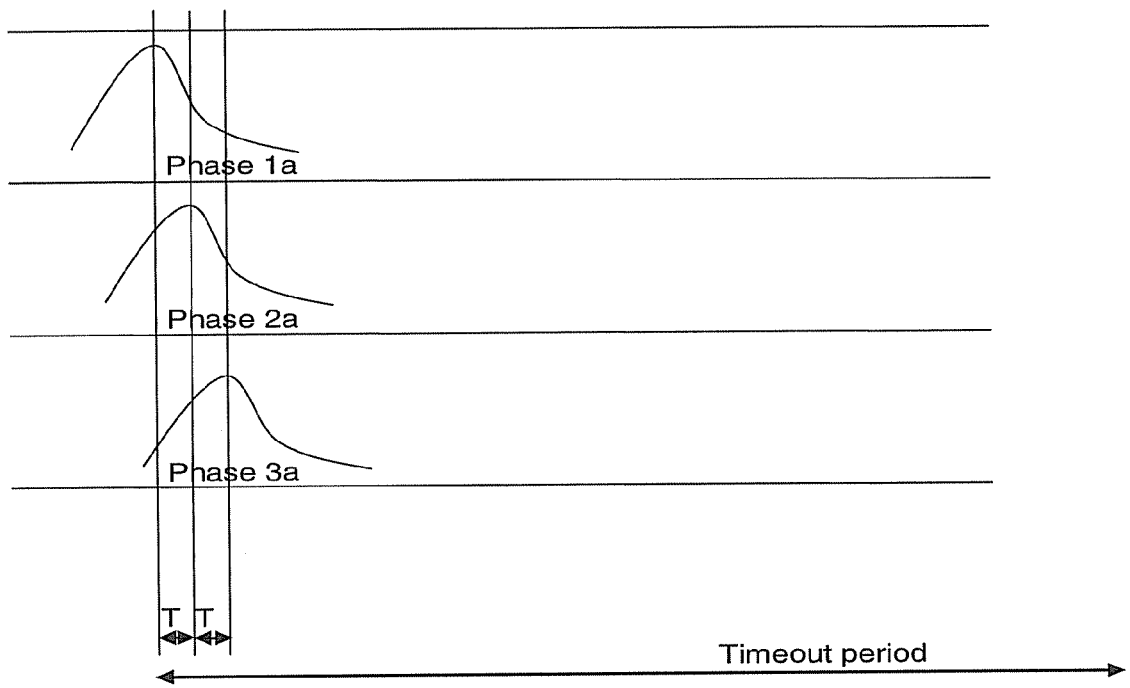
FIG. 13 shows a graphical representation of pulses occurring within a time frame, typically for illustrating a noise pulse or impulse detected on all three phases.

Regarding noise discrimination, the validation module 40 is able to determine if an input impulse or pulse occurs in two or more phases 14, 16 or 18, as shown in FIG. 6 (here the phases 1a, 2a and 3a are referred to as X, Y and Z respectively), with the same polarity within a defined time frame, $T_{nd}$. If this is the case, then the validation module 40 treats the input impulse as noise and consequently ignores it. It follows from FIG. 12 that the validation module 40 is arranged to compare phases for example 1a, 2a, and 3a with each other in order to make the determination. Referring now also to FIG. 13 of the drawings, it follows that for noise identification the validation module 40 is arranged to determine if pulses on phases 1a, 2a, and 3a have similar peak amplitudes, similar spectral content, or the same polarity. The processor 34 includes a peak detector 47 to determine peak values of the impulses. In one example embodiment, the validation module 40 makes use of the peak detector 47 to determine if pulses have similar peak amplitudes. In addition, the validation module 40 is arranged to determine if all the pulses occur within overlapping timeout periods, and also if the time of arrival is very close (within a present number of clock cycles). It follows that if this type of pulse activity is detected or determined, the pulses can be considered to be external noise and the pulses are discarded accordingly.

Figure 7:
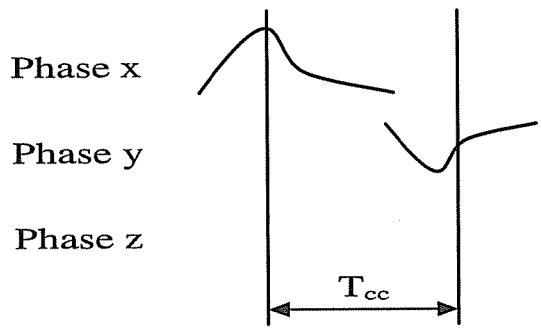
FIG. 7 shows a graphical representation of pulses occurring within a time frame, typically for illustrating an example of cross coupling.
Figure 8:
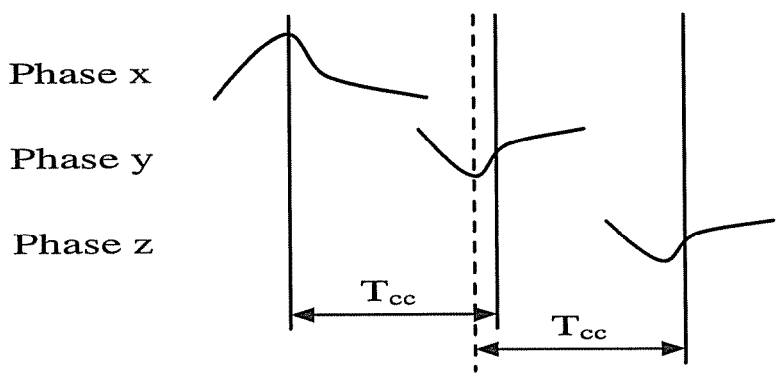
FIG. 8 shows another graphical representation of pulses occurring within a time frame, typically for illustrating an example of cross coupling.

Cross coupling can occur between two phases 14, 16 or 18 only or between all three phases 14, 16 and 18 of the power system 12. The validation module 40 determines or detects that a pulse occurs on one phase for example 1a and a pulse with opposite polarity occurs on either of the other two phases 2a or 3a within a defined time frame, as shown in FIG. 7 (here the phases 1a, 2a, and 3a are illustrated as X, Y and Z respectively), the validation module 40 is operable to ignore the second pulse as it is cross-coupled from the other phase (either 2a or 3a). In this regard, the time frame may be user defined or programmable within certain limits for example, the minimum cross-coupling time frame $T_{CC}$ may be 250 ns whereas the maximum cross-coupling time frame $T_{CC}$ may be 2000 ns. In order to make the determination as described, the validation module 40 is arranged to determine if the pulses have different peak amplitudes, similar spectral content, if two detected pulses have opposite polarity, and if both pulses occur within overlapping timeout periods The validation module 40 is also arranged to determine or detect if a pulse occurs on one phase 1a for example and also if a pulse with opposite polarity occurs on both the other phases 2a and 3a for example within a defined overlapping time frame as shown in FIG. 8 (here the phases 1a, 2a, and 3a are referred to as X, Y and Z respectively). In these circumstances, the validation module 40 is arranged to ignore the two pulses of opposite polarity and allow only the first pulse to be processed.

The validation module 40 is arranged to determine if input impulses are cross-coupled across two phases by determining if the impulses have different peak amplitudes, similar spectral content, if one impulse has opposite polarity to the other two, and if all pulses occur within overlapping timeout periods. It then follows that if the impulse with the opposite polarity occurs first the impulses can be considered to be cross-coupled. If this is the case, this particular impulse is retained while the other two are discarded else all the impulses are retained. Instead, or in addition, all three impulses are optionally stored.

Figure 9:
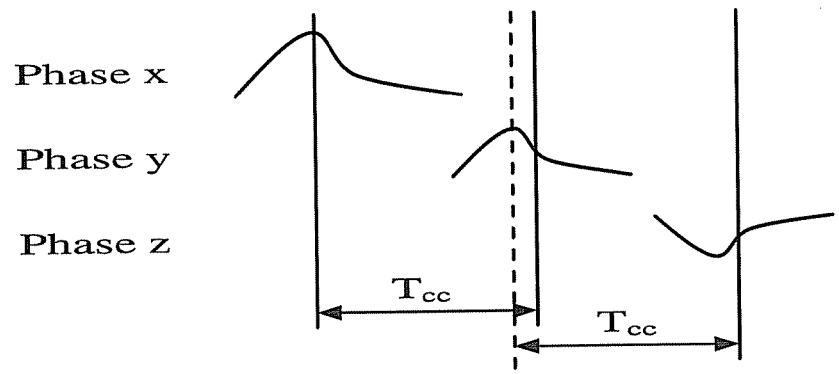
FIG. 9 shows another graphical representation of pulses occurring within a time frame, typically for illustrating an example of cross coupling.

The validation module 40 is further arranged to determine or detect if a pulse occurs on one phase for example 1a, and to determine or detect if a pulse with the same polarity occurs on either of the other two phases 2a or 3a within a defined timeframe. The validation module is operable to also detect or determine if a pulse of opposite polarity occurs on the third phase 3a for example 18 within the defined overlapping timeframe as shown in FIG. 9 (here the phases 1a, 2a, and 3a are illustrated as X, Y and Z respectively). In this scenario the validation module 40 is arranged to ignore the pulse of opposite polarity i.e. the third pulse to arrive at phase 3a (or Z) and the validation module 40 only allows the other two pulses at 1a and 2a (X and Y) to be processed. The two pulses are typically processed as individual events.

Figure 10:
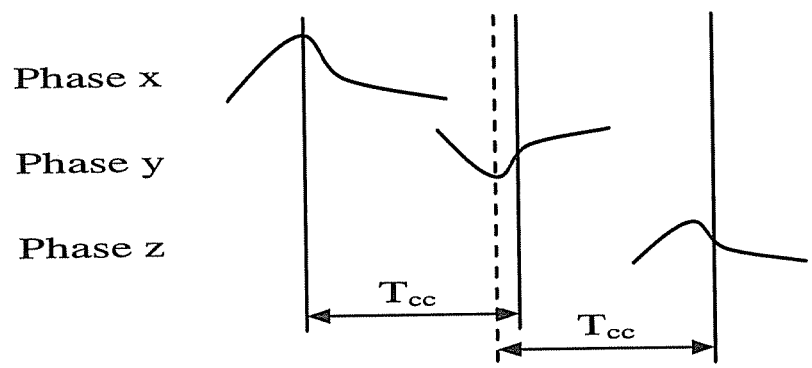
FIG. 10 shows another graphical representation of pulses occurring within a time frame, typically for illustrating an example of cross coupling.

In a similar fashion, the validation module 40 is arranged to determine or detect if a pulse occurs on one phase for example 1a and a pulse with opposite polarity occurs on either of the other two phases 2a or 3a within a defined timeframe. Where a pulse with the same polarity as the first pulse occurs on the third phase say 3a within the defined overlapping timeframe as shown in FIG. 10, the validation module 40 is arranged to ignore the pulse of opposite polarity i.e. the second pulse to arrive and the validation module 40 is further arranged to allow the other two pulses to be processed as individual events.

At this stage it is necessary to consider inter-process data rates and in this regard, where a full band filter channel is used for validation, it must be mentioned that the information to be transferred from the phase processes to the noise discrimination and cross-coupling validation processes will be the magnitude and polarity from each band in the filter bank, a flag to indicate from which sensor 20 on the phase 14, 16 or 18 the data has been captured, and the time from the last zero-crossing to 5 ns resolution. There will typically be 10-bits of data per filter band, and a time stamp will be 22 bits. Thus a total of 113 bits will used. Further, the minimum separation of events will be 100 ns. Therefore the maximum required data rate, will be at most 1.13 Gbits/s, (113 bits at 100 ns).

Figure 15:
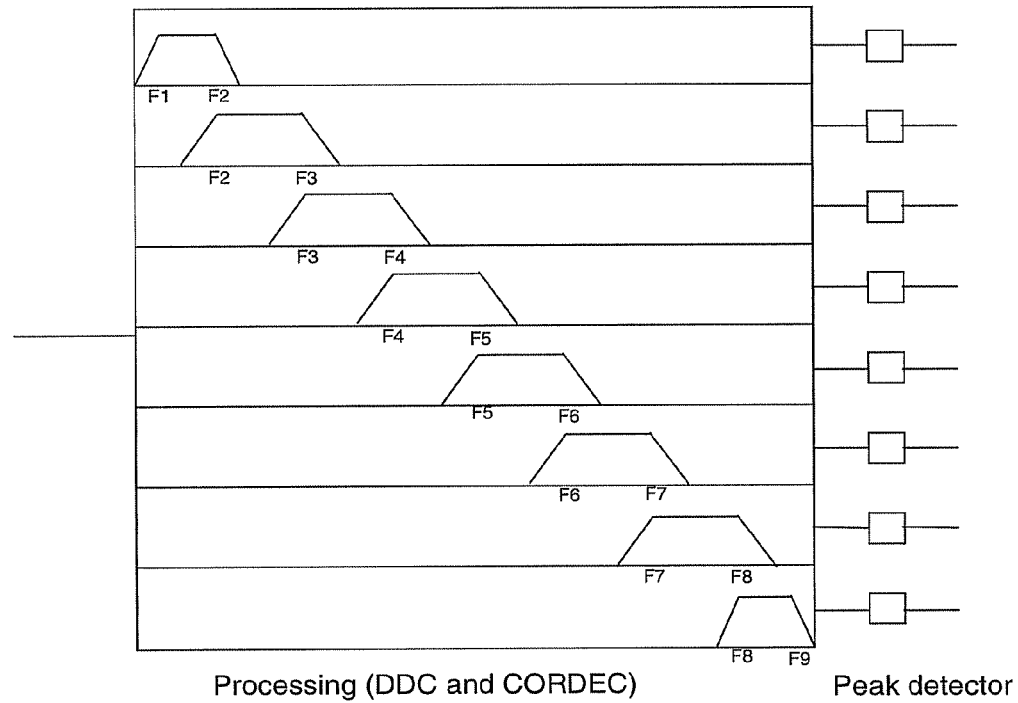
FIG. 15 shows a graphical representation of a possible frequency response in each band.

In an example embodiment, the processor 34 includes a frequency spectrum generating module 42 operable to generate a frequency spectrum of a validated input impulse or pulse. It will be appreciated that the validated input impulse is the input impulse which the validation module 40 allows to be processed. The frequency spectrum generating module 42 typically includes or makes use of filter banks to generate a frequency spectrum of the validated input impulse. Referring also to FIG. 15 of the drawings, each filter bank typically comprises a bank of any number of filters from one upwards. For the example given here and for clarification, eight filters for each channel are illustrated, however, any number of filter banks from one upwards may be used. Typically, the filters are band-pass filters with fixed bandwidths. In an example embodiment, no filter pass-band overlaps with any other filter pass-band. Each high frequency −3 dB point cut-off corresponds with the next bands low frequency −3 dB cut-off point. Typically, the lowest frequency cut-off point of the lowest frequency filter is not less than 100 kHz.

Due to the filters being implemented as finite impulse response (FIR) filters, it will be understood by those skilled in the art that the bandwidth of the filters is defined as the frequency range within which the response meets the ripple requirement. In this regard, the passband ripple of the filters is typically 0.5 dB and the stopband attenuation of the filters is preferably 55 dB. The bands of the filters as hereinbefore described are shown below in Table 1:

TABLE 1

Typical Filter Bands for Filter Bank (8 band example)

| Filter No | Lower Cutoff (MHz) | Upper Cutoff (MHz) | Bandwidth (MHz) |
|---|---|---|---|
| 1 | 0.13162925 | 1.04024575 | 0.9086165 |
| 2 | 1.04024575 | 3.158973 | 2.11872725 |
| 3 | 3.158973 | 7.387902 | 4.228929 |
| 4 | 7.387902 | 16.830848 | 9.442946 |
| 5 | 16.830848 | 33.169152 | 16.338304 |
| 6 | 33.169152 | 66.830848 | 33.661696 |
| 7 | 66.830848 | 133.169152 | 66.338304 |
| 8 | 133.169152 | 266.830848 | 133.661696 |
| 9 | 0.15 | 160 | 159.85 |

Each filter bank further comprises a complex mixer to down-convert the input impulse, a low pass filter (implemented as a FIR filter) and a decimation block to reduce a data sample rate to an appropriate processing rate. It will be appreciated that a ninth wide band frequency channel may be optionally provided.

In an example embodiment, a peak value from each of the eight bands is stored for further processing. The eight peak values are then normalised (as will be described below) to the highest peak vale and the highest peak value is stored with the eight normalised values, for further processing.

In this regard, the processor 34 also includes a normalising module 44 arranged to normalise the frequency spectrum or the peak values obtained from the frequency spectrum generating module 42 to a maximum level in spectrum thereby providing a normalised spectrum. In an example embodiment, normalised peak values are stored in the look-up table 38 for known faults etc.

It follows that the processor 34 also includes a monitoring module 46. The monitoring module 46 is operable to monitor the power system 12 via the sensors 20 for impulses of interest occurring therein. The monitoring module 46 may be operable to implement a peak determination algorithm as will be described below. It will be appreciated however that the monitoring module 46 may also be responsible for overseeing the processing of an impulse once it is received or detected.

In a preferred embodiment, the processor 34 includes a comparator 48 operable to compare the frequency spectrum generated for the validated input impulse with the existing fault spectra stored in the database 36, in particular the fault table 38, at least to determine if the generated frequency spectrum of the validated impulse substantially matches any of the existing fault spectra. It follows that the comparator 48 uses the normalised frequency content of a pulse for comparison with the contents of the look-up table 38. A user defined measure of equivalence may be used by the comparator 48 to perform this function. In an example embodiment, the comparator 48 is arranged to apply a fault matching algorithm to compare the frequency spectrum generated for the validated impulse with the existing fault spectra stored in the fault table 38. The fault matching algorithm is typically the sum of squared differences as given in the following equation:

$$\text{Sum of squared differences, } \alpha_k = \sum_{n=1}^{8} (x_{k,n} - y_n)^2$$

where: $x_{k,n}$ is component n in row k $y_n$ is $n^{th}$ spectral component of normalised spectrum It will be appreciated that if a generated frequency spectrum substantially matches any of the existing fault spectra, the processor 34 is arranged to raise a flag to that effect. In addition to raising the flag, the processor 34 is arranged to retrieve a scatter plot corresponding to the fault from the database 36 (discussed in greater detail below). In an example embodiment, the flag is a fault descriptor. In other example embodiments, the flag may allow the PDM system 10 to generate a fault descriptor. However, if the generated frequency spectrum does not substantially match any of the existing fault spectra, the processor 34 is arranged to store data or the generated frequency spectrum of the validated impulse in the fault table 38 of the database 36, in addition to raising a flag to that effect. For clarity, the fault descriptor is typically a descriptor containing information including at least a fault number which is an 8-bit number, an impulse amplitude which is an 8-bit number derived from phase and magnitude information from the ninth band as mentioned above, a time stamp which is an 8-bit number containing which time slice in the minor time frame that the impulse occurred, information indicative of phase which is a 2-bit number indicating which phase 14, 16 or 18 the fault event occurred on, information indicative of the sensor 20 which is a 1-bit number indicating from which sensor 20 on the phase 14, 16 or 18 the event has been captured, and a flag which is a 1-bit flag, which changes state after each major time frame.

In an example embodiment, if the spectra matches a known spectra in the look-up table 38, the peak value associated with that spectra is either added to a scatter plot associated with that spectra, or, if no scatter plot exists, a new scatter plot is generated by the data generating module 50. If the scatter plot contains signal information, the normalised spectra of this pulse is added to the fault spectra, and if it contains noise, it is added to the noise spectra. This facilitates the learning aspect of the PDM system 10.

Figure 17:
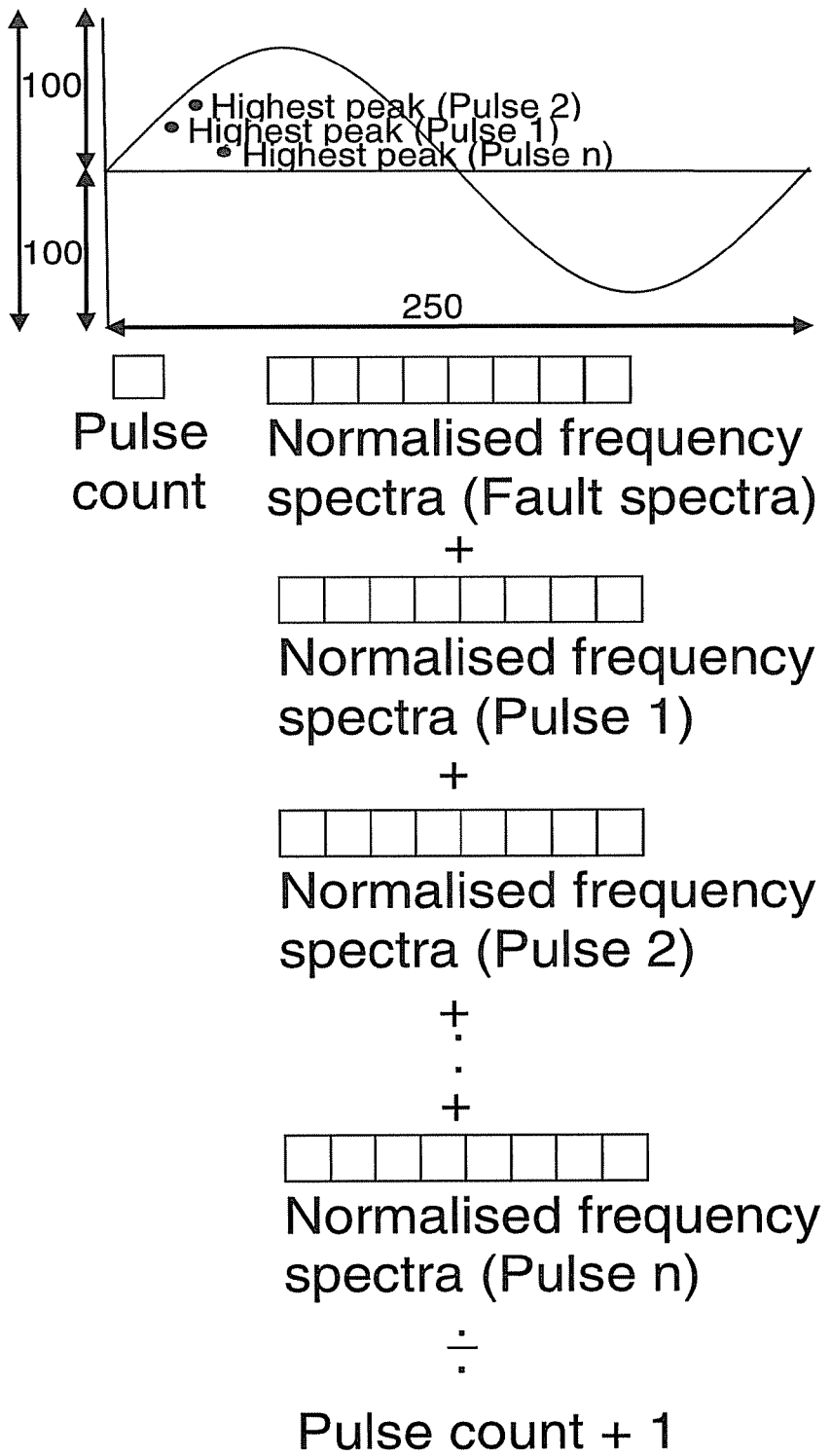
FIG. 17 shows an illustration of a scatter plot for a number of pulses with a known spectrum that is stored in the database with a method of averaging the peak values for each of the frequency components for each subsequent similar impulse.

Referring now also to FIG. 17 of the drawings, if an input impulse or in other words a generated frequency spectrum of the impulse matches a known fault spectrum and no scatter plot exists for this particular spectrum, the data generating module 50 is arranged to generate a new scatter plot for the fault. A stored normalised frequency spectrum for the fault is accordingly associated with the generated scatter plot and is stored in the database 36 together with the scatter plot. The peak value for the impulse spectra is placed on the scatter plot in its correct time slice. In addition, the generated frequency spectrum is also averaged with the known fault spectrum, this is done by keeping a record of the number of impulses (pulse count) on the particular scatter plot. New impulses with similar frequency spectra are added to the scatter plot as they occur. As the new impulses are added, the overall normalised frequency spectra associated with the scatter plot is average according to the equation:

(normalised fault spectra+total of all other similar specta)/(Impulse count+1)

Figure 18:
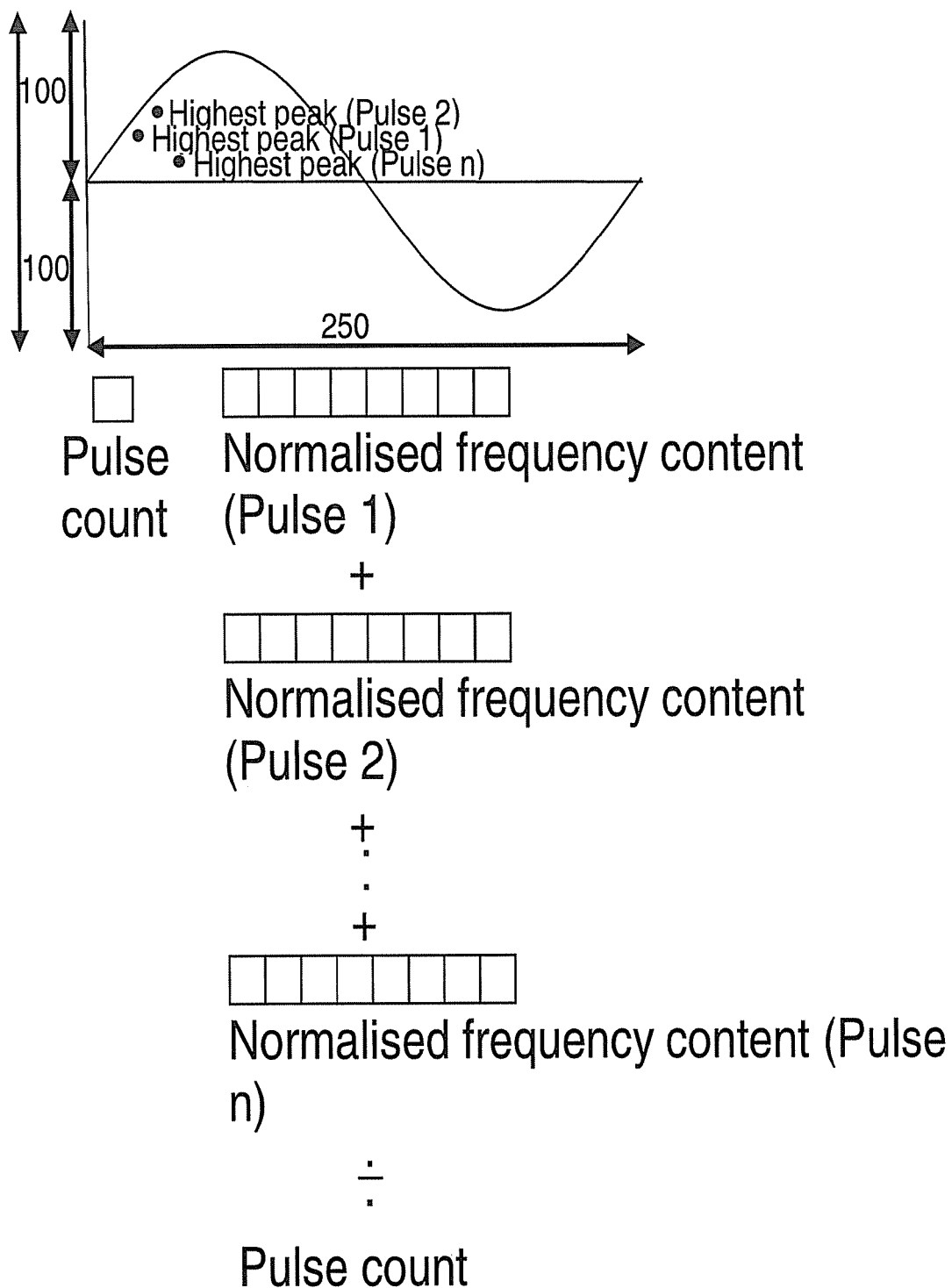
FIG. 18 shows an illustration of a scatter plot for a pulse with an unknown spectrum (one that is not stored in the database of FIG. 2) with a method of averaging the peak values for each of the frequency components each subsequent similar impulse.

Referring now also to FIG. 18, if a generated frequency spectrum of an impulse does not substantially match any known fault spectra and no scatter plots exist for the generated spectrum, a new scatter plot is generated therefore by the data generation module 50. The peak value for the impulse spectra is placed on the scatter plot in its correct time slice. It will be noted that in order to do this a record of the number of impulses on the scatter plot (pulse count) is kept. New impulses with similar frequency spectra are added to the scatter plot, as they occur. It will be appreciated that in order to do this, the normalised spectra of new pulses are compared with both the fault table 38 and the generated spectra of impulses not yet stored in the fault table 38. As the new impulses are added, the overall normalised frequency spectra associated with the scatter plot is averaged. The averaging process is represented by the following equation:

(total number of all similar spectra)/(impulse count)

In an example embodiment, if an impulse count of greater than 10 per cycle is measured continuously for example within a 10 second period, the impulse phenomena CaO be considered to be noise. The peak impulses are moved to the scatter plot for all recorded impulses. The normalised spectra are stored in the fault table 38 as noise. Once this is done, the scatter plot is accordingly discarded.

It will be appreciated that if a pulse count of less that 10 per cycle is measured continuously within a 10 second period for example, the impulse phenomena can be considered to be a known fault. The normalised spectra are stored in the fault table 38 as faults. It will be appreciated that the scatter plot is therefore stored in the database 36 and is associated with a known fault.

If a pulse is identified, by comparison with the noise spectra in the look up table 38, as a noise pulse, the peak value for the pulse spectra is placed on the scatter plot for all recorded pulses, in its correct time slice.

In a preferred example embodiment, the processor 34 includes a scratchpad or scratchpad area 41. The scratchpad area 41 is used to store the number of occurrences of a particular fault spectrum in a minor time frame, and a cumulative total for each band of the levels in that band from the normalised spectrum. In an example embodiment, the scratchpad area 41 keeps the pulse count as hereinbefore described. It follows that the raising of the flag when the comparator 48 determines a substantial match may include incrementing the occurrence of a particular fault in the scratchpad area 41. In one example embodiment, the scratchpad area 41 may conveniently provide a platform for the scatter plot manipulation as hereinbefore described.

It will be appreciated that the fault table 38 is typically updated with new spectral information associated with an impulse whenever there is no substantial match between the generated frequency spectrum of that impulse and the spectra in the fault table 38. It therefore follows that whenever the host computer 22 is connected to the PDM system 10, the fault table 38 is transferred to the host computer 22. In this regard, if there are only a maximum of twenty faults per minor time frame, up to twenty fault descriptors (28-bits) may be transferred in a minor time frame; thus the maximum data rate for fault descriptors will be 28 kbits/s. Where all the fault descriptors relate to different faults then up to twenty fault table updates (104 bits) are transferred in a minor time frame; thus the maximum data rate for fault table updates will be 104 kbits/s. With the data rates above, the maximum data transfer rate over the USB link from the PDM system 10 to the host computer 22 is typically 132 kbits/s.

Figure 19:
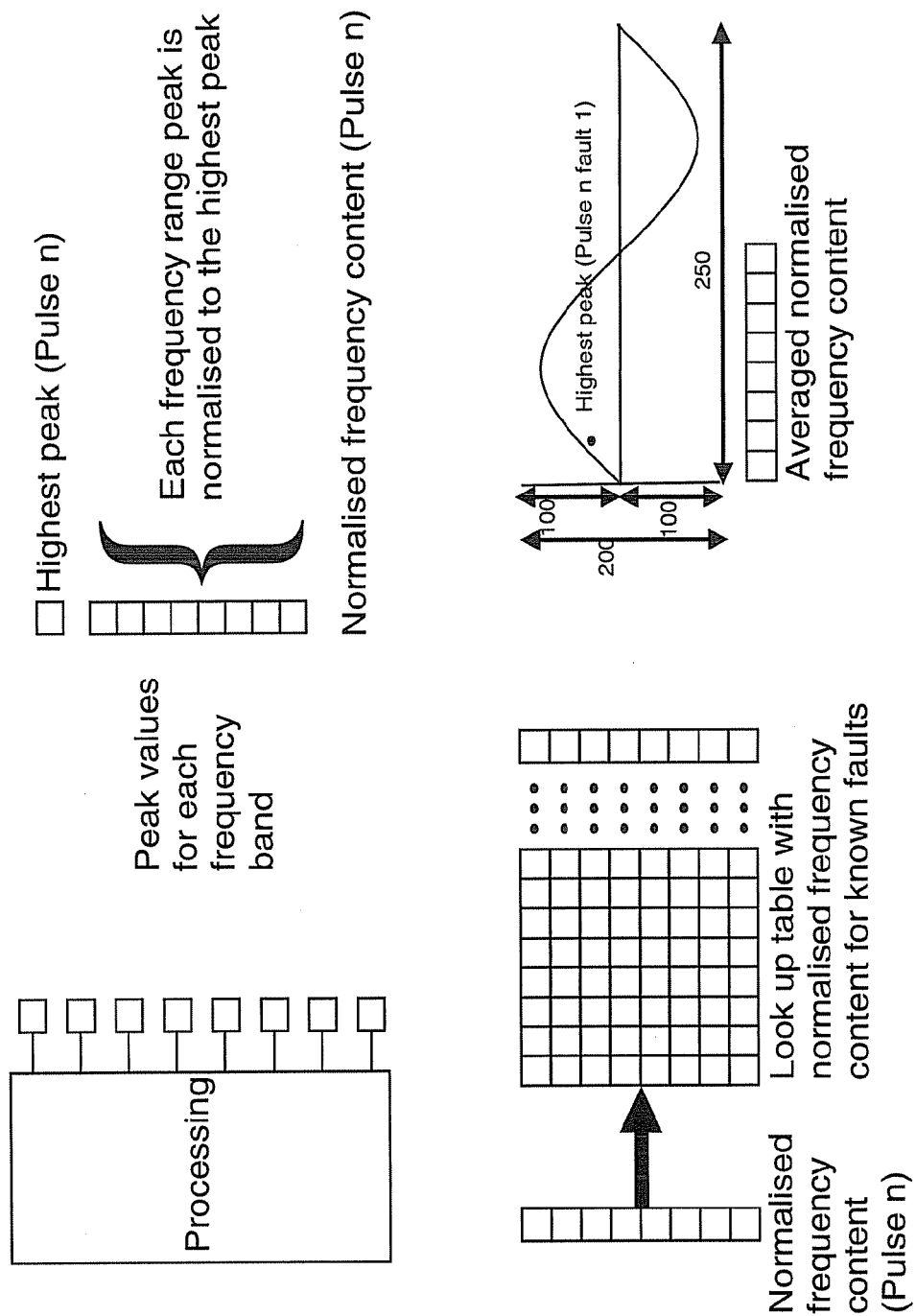
FIG. 19 shows a high level block diagram for how a pulse is processed.

To summarise, reference is made to FIG. 19 of the drawings. An input pulse or signal is received by the processor 34. The processor 34 splits the signal between eight frequency bands. Each frequency band has a peak associated with it. The eight frequency bands constitute a frequency spectrum. This frequency spectrum is normalised and the highest peak value is stored, with the eight normalised values of the frequency spectrum. Eight frequency bands are used for demonstration only as there could be any number of frequency bands from one upwards.

The normalised frequency spectrum is compared with a number of predefined frequency spectra that are stored in a look-up table 38. If the spectra match known spectra in the look-up table 38, the peak value is displayed on a scatter plot that is associated with the identified frequency spectrum. If there is no match, a new scatter plot is started.

Figure 20:
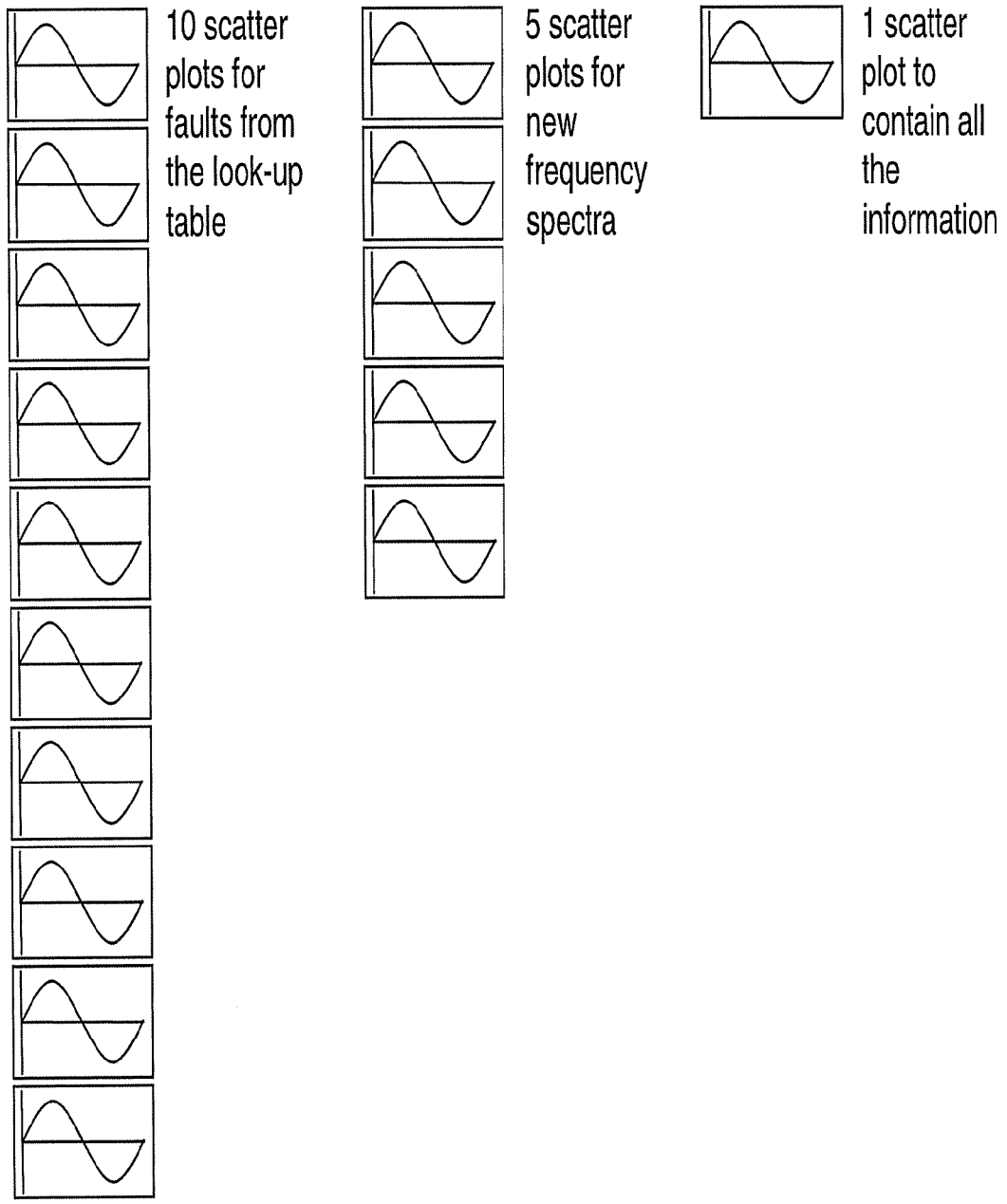
FIG. 20 shows an example illustration of the possible total number of scatter plots.
Figure 21:
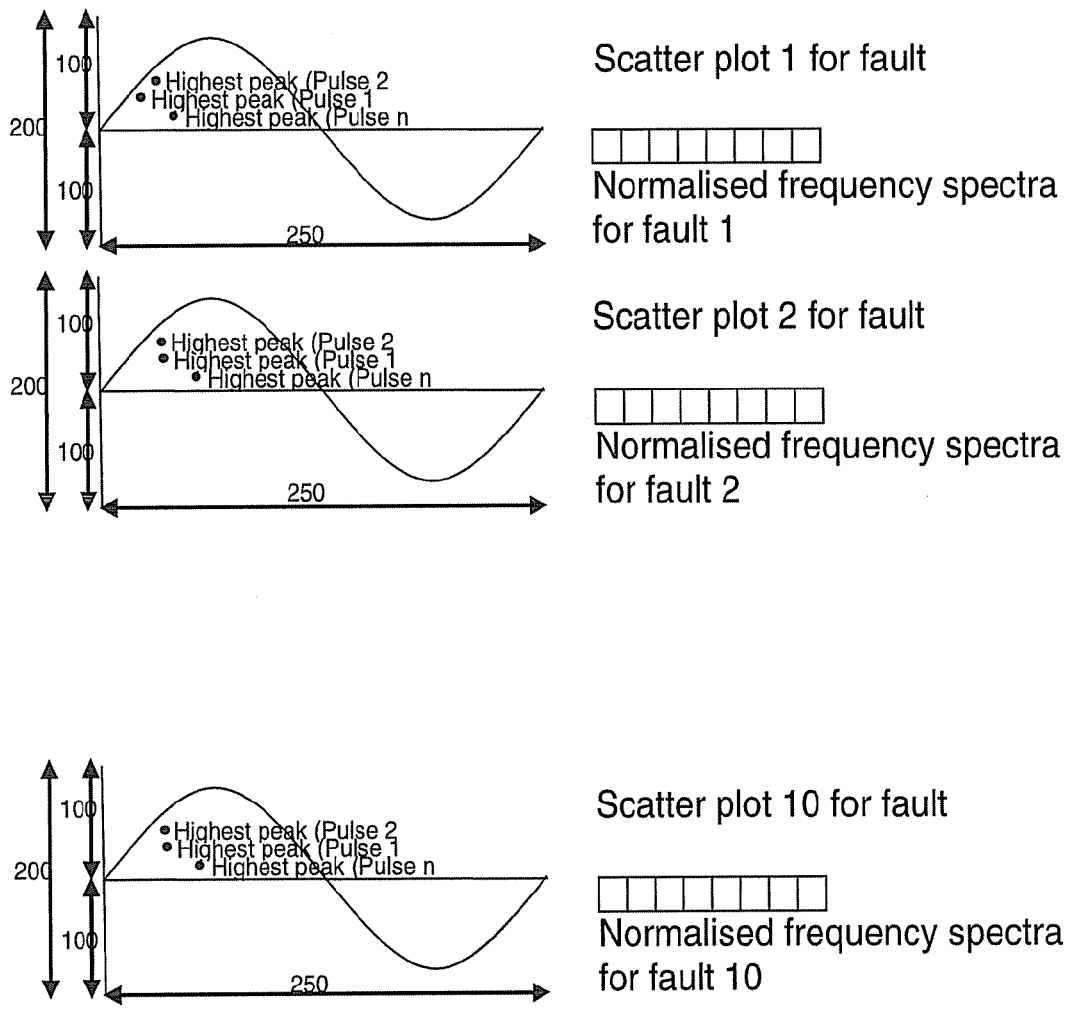
FIG. 21 shows an example illustration of the scatter plots for the spectra from the look-up table.
Figure 22:
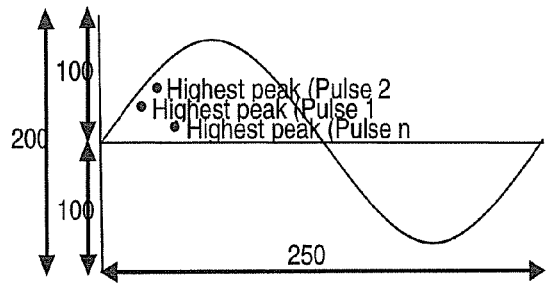
FIG. 22 shows an example illustration of scatter plots for new spectra.
Figure 22:
Figure 22:
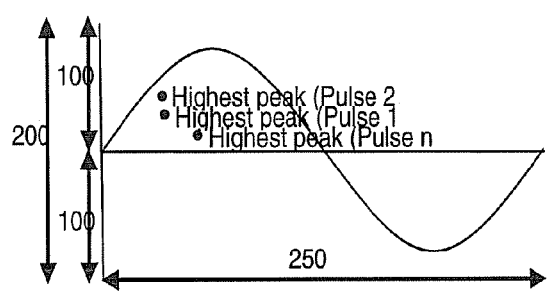
Figure 22:
Figure 22:
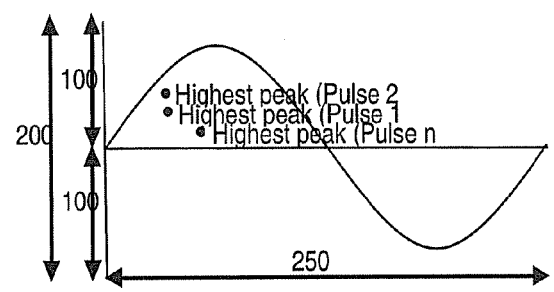
Figure 22:
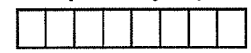

Regarding the scatter plots and referring now also to FIGS. 20 to 22 of the drawings, a total number of scatter plots required for each type of scatter plot is shown in FIG. 20. In particular FIG. 20 shows ten scatter plots from the look-up table 38 (this can be any number from one upwards), five scatter plots from new spectra (this can be any number from one upwards), and one scatter plot for all pulses.

FIG. 21 shows example scatter plots for the spectra from the look-up table 38 while FIG. 22 shows scatter plots for the new spectra.

Figure 4:
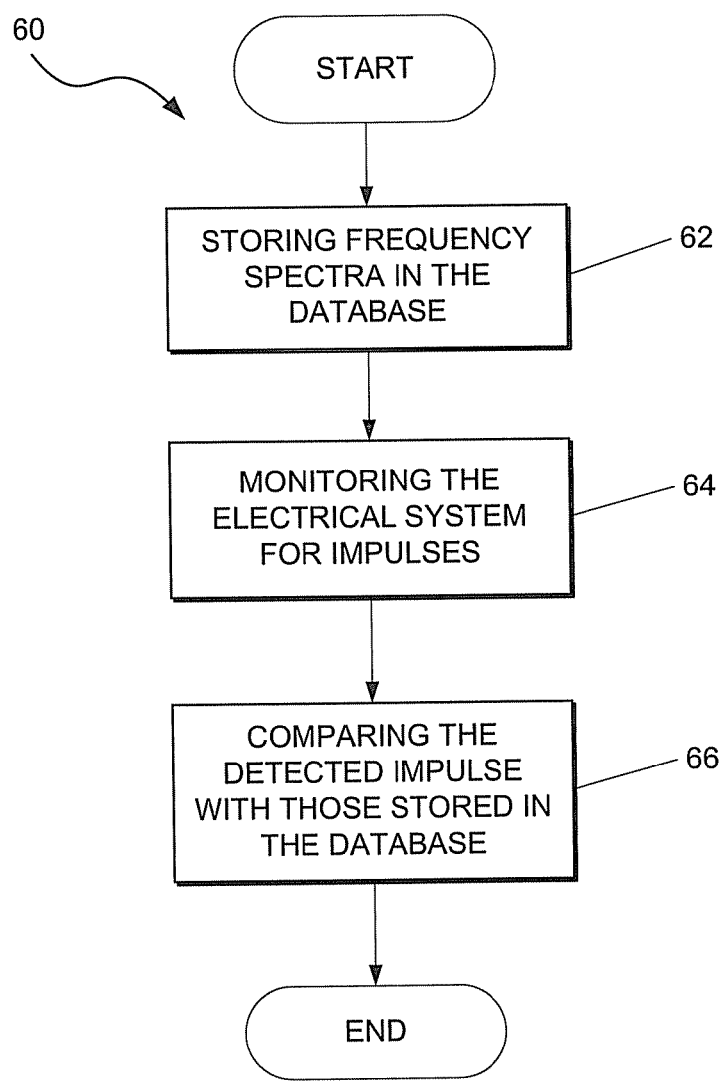
FIG. 4 shows a flow diagram of a method in accordance with an example embodiment.
Figure 5:
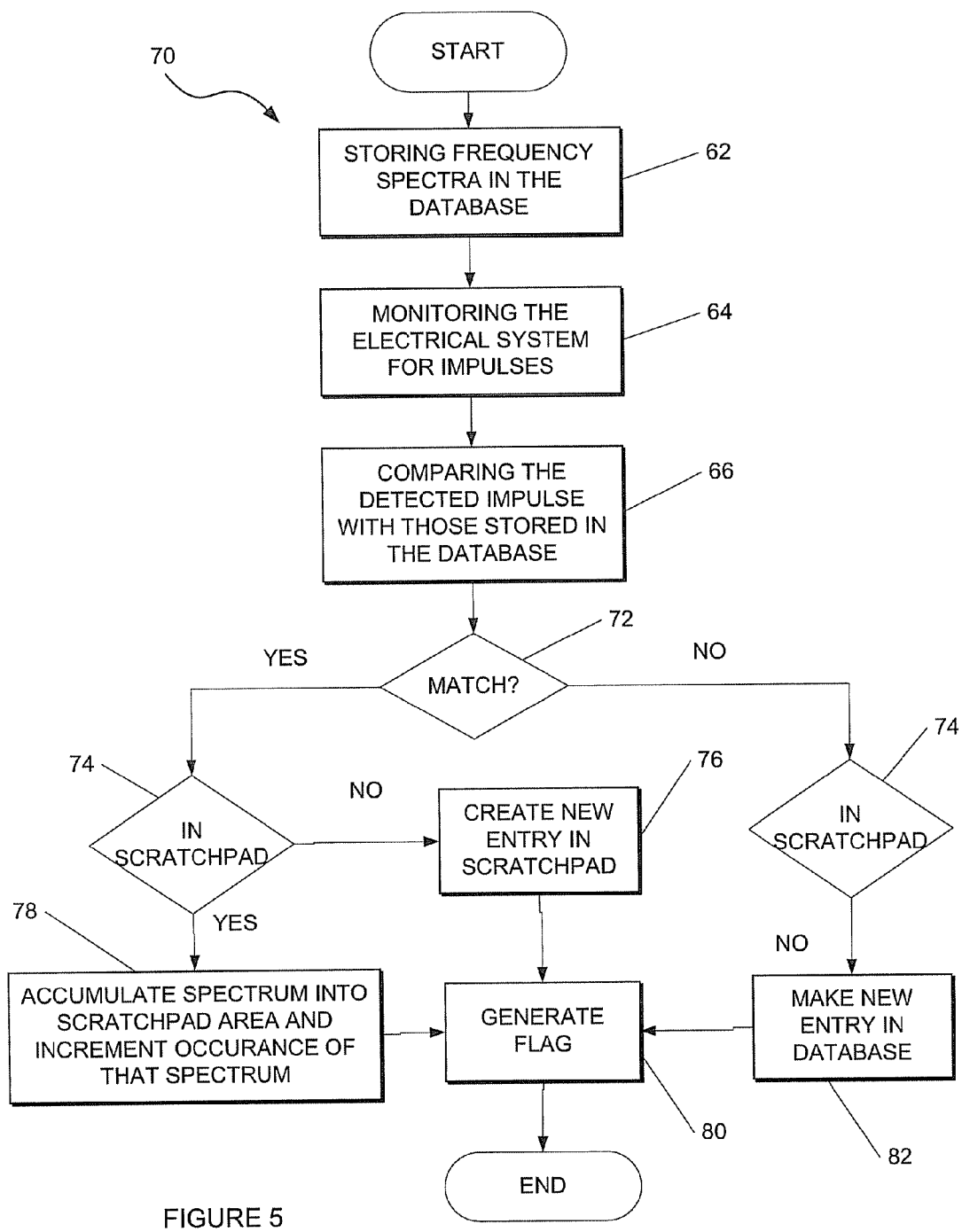
FIG. 5 shows another flow diagram of a method in accordance with an example embodiment.

Example embodiments will now be further described in use with reference to FIGS. 4 to 7. The example methods shown in FIGS. 4 and 5 are described with reference to FIGS. 1 to 3, although it is to be appreciated that the example methods may be applicable to other systems (not illustrated) as well.

Referring to FIG. 4 of the drawings, a flow diagram of a method in accordance with an example embodiment is generally indicated by reference numeral 60. The method 60 includes storing, at block 62, a plurality of fault spectra in the database 36, in particular in the fault table 38 of the database 36. This may typically be a prior step wherein fault spectra or spectral components of or data associated with known fault spectra are stored in the fault table 38.

The method 60 further includes monitoring, at block 64, the power system 12 to receive or detect signals or impulses occurring therein. For brevity, it will be appreciated that receiving the signal or impulse, or information associated therewith, may be understood to include detecting the signal or impulse. This may be facilitated by way of the monitoring module 46. In particular, it will be appreciated that input impulses are initially detected by use of a peak detection algorithm as implemented by the monitoring module 46. There will typically be two parameters associated with peak detection, both of which will be user definable. The peak detection as implemented by the monitoring module 46 will be analogous to an analogue track-and-hold with a reset, i.e. the output of a peak detector will follow the input as long as the present input is greater then the previous input, otherwise it will stay at the maximum value it has previously reached. There will be a reset to enable the peak detector to resume track mode. The two user definable parameters are an absolute threshold which an input signal has to exceed before it can be declared as a potential peak, and a peak detect window which will define how long the held value has to be there without being exceeded before a peak is declared. When a peak is declared the monitoring module 46 will resume track-and-hold mode.

The peak detect window value will determine the absolute maximum rate at which valid peaks will be declared. In an example embodiment, the peak detect window is typically 1.5 μs. This would mean that the absolute maximum valid peak rate would typically be 13333 in 20 ms, with most of the peaks being noise. It follows that if a threshold is set for the peak detector, which is above the noise floor, the number of valid peaks would be significantly reduced.

Once an impulse is detected, the method 60 may include comparing, at block 66, by way of the comparator 48, a generated frequency spectrum of the detected impulse with the existing fault spectra stored in the fault table 38 to at least determine if the generated frequency spectrum of the detected impulse substantially matches any of the existing fault spectra (described below). It will be understood by those skilled in the art that in order for the comparator 48 to make a comparison as contemplated, the detected input impulse is initially processed by the validation module 40 to validate the impulse as hereinbefore described. The validated impulse is then normalised by way of the normalising module 44. Finally before comparing at block 66, the frequency spectrum of the validated impulse is generated by way of the frequency spectrum generating module 42 in order to facilitate the comparison as contemplated in block 66.

Referring now to FIG. 5 of the drawings where a flow chart of another method in accordance with an example embodiment is generally indicated by reference numeral 70. The first three steps of the method 70 is similar to the three steps described above with reference to FIG. 4 and therefore same reference numerals will be used to indicate them respectively.

The method 70 shows in greater detail the outcomes of the comparing step i.e. at block 66. In particular, the method 70 includes determining, at decision block 72, whether the generated frequency spectrum of the detected impulse substantially matches any of the existing fault spectra stored in the fault table 38. It will be noted that the comparator 48 implements a fault matching algorithm as hereinbefore described in order to make this comparison. If a frequency spectrum of the detected impulse substantially matches any of the existing fault spectra, the method may include raising a flag to that effect (as will be explained below). In particular, if there is a match, the method 70 then determines, at decision block 74, whether faults of that particular type are contained in the scratchpad area 41. If faults of that particular type are contained within the scratchpad area, the method 70 includes accumulating, at block 78, that particular spectrum into the scratchpad area 41 and incrementing the number of occurrences of that particular spectrum. If however the spectrum does not exist in the scratchpad area 41, the method 70 includes creating, at block 76, a new entry for that particular spectrum in the scratchpad area 41.

If however there is no substantial match between frequency spectrum of the detected impulse and any of the existing fault spectra, the method 70 includes raising a flag to that effect (as will be explained below). In particular, if no substantial match is found and the particular spectrum of the detected impulse is not in the scratchpad area 41, block 74, the method 70 includes making, at block 82, a new entry in the scratchpad area 41 and tagging the spectrum of the detected impulse as a new fault spectrum. It will be appreciated that block 82 includes making a new entry in the database 36 for the new fault detected.

As an aside, it will be noted that for any fault identified in a minor time frame, the means of the spectral points collected over that time frame is determined. Also if the fault is already in the fault table 38 then the overall means of the spectral points is calculated. It follows that the fault table 38 is periodically updated with these new means. When a fault is updated than the new entry is optionally sent to the host computer 22 to enable a duplicate of the fault table 38 to be maintained at the host computer 22. Data associated with a fault typically includes a fault number (8-bits), values of the eight spectral components (80-bits in total) and a number of accumulations value (16-bits).

The method 70 then includes raising or generating, at block 80, a flag in the form of a fault descriptor as hereinbefore described for the respective outcomes. It will be appreciated that in this particular example embodiment, raising a flag includes generating a fault descriptor as hereinbefore described. In other example embodiments, raising a flag may include alerting personnel of a match or not by way of an alarm signal, or the like.

It will be appreciated that in this way, impulses detected in a power system are monitored and analysed to determine conveniently their fault characteristics.

The invention as hereinbefore described provides a convenient way to monitor partial discharges occurring in three-phase power systems. By using spectral analysis to identify partial discharges, undesirable outcomes associated with partial discharges may at least be mitigated or even circumvented.

The invention claimed is:

1. A method of monitoring partial discharges occurring in an electrical system, the method comprising:
   receiving a pulse from the electrical system;
   identifying if the pulse is noise or a duplicate pulse;
   if the pulse is not noise or a duplicate pulse then converting the pulse from an analogue to a digital signal;
   breaking the pulse into two or more predefined frequency components;
   normalizing the two or more predefined frequency components to a maximum level;
   comparing the amplitudes of the two or more normalized predefined frequency components associated with the received pulse with amplitudes of other stored pulses at the same predefined frequency components to identify similar pulses which indicate a known fault condition;
   if the pulse is identified as a pulse which indicates the known fault condition, then storing data in a database associating the pulse with the two or more normalized predefined frequency components and the known fault condition;
   grouping pulses with similar normalized predefined frequency components in a scatter plot stored in the database;
   if the normalized predefined frequency components of the pulse are not similar to the normalized frequency components of a current grouping then creating a new grouping of pulses stored in the database; and
   if the pulse is identified as a pulse which indicates the known fault condition, then notifying a user that the fault condition exists.

2. The method as claimed in claim 1, the method comprising generating a scratchpad to store a predefined number of normalized spectra for different pulses together with peak values associated with pulses.

3. The method as claimed in claim 1, the method comprising performing signal processing on the received pulse.

4. The method as claimed in claim 1, wherein comparing the frequency spectrum associated with the detected or received pulse with the existing fault spectra stored in the database is done by way of a fault matching algorithm.

5. A system for monitoring partial discharges occurring in an electrical system, the system comprising:
   a database for storing a plurality of fault spectra;
   a monitoring module for monitoring the electrical system to receive pulses occurring in the electrical system; and
   an analog to digital converter to convert the pulse from an analog signal to a digital signal;
   a validation module arranged to validate the received pulse by identifying if the pulse is noise or a duplicate pulse;
   a peak detector to determine a peak value of the received pulse;
   a frequency spectrum generating module operable to generate a frequency spectrum of the pulse received by the monitoring module by breaking the pulse into two or more predefined frequency components;

a normalizing module arranged to normalize the peak values of each of the two or more predefined frequency components of the received pulse to a maximum level;

a comparator operable, once a pulse is received, to:

compare the amplitudes of the two or more normalized predefined frequency components associated with the received pulse with amplitudes of other stored pulses at the same predefined frequency components to identify similar pulses which indicate a known fault condition;

if the pulse is identified as a pulse which indicates the known fault condition, then storing data in a database associating the pulse with the two or more normalized predefined frequency components and with the known fault condition;

group similar pulses in a scatter plot stored in the database; and a display to display a point on the scatter plot representing the digitized peak of the received pulse together with points representing other identified similar pulse peaks.

6. The system as claimed in claim 5, the system being arranged to raise a flag if a frequency spectrum of the received pulse substantially matches any of the existing fault spectra.

7. The system as claimed in claim 6, wherein the system is arranged to store data or the frequency spectrum of the received pulse in the database.

8. The system as claimed in claim 5, wherein the system comprises a data generating module operable to generate data associated with the received pulse.

9. The system as claimed in claim 5, wherein the monitoring module is in communication with a plurality of sensors, the sensors being arranged to monitor each phase of the electrical or power system.

10. The method as claimed in claim 1, comprising generating scatter plots from a sub-set of a fault spectra of the received pulse.

11. The method according to claim 4, wherein the fault matching algorithm is the sum of squared differences as given in the following equation:

Sum of squared differences, $$\alpha_k = \sum_{n=1}^{8} (x_{k,n} - y_n)^2$$

where: $x_{k,n}$ is component n in row k $y_n$ is $n^{th}$ spectral component of normalised spectrum.

12. The method of claim 1, wherein the step of identifying if the pulse is noise or a duplicate pulse comprises determining a direction of travel of the received pulse, determining if the received pulse is noise or not by at least determining if the pulse occurs in two or more phases of the electrical system, and determining if the received pulse is cross coupled between the two phases.

\* \* \* \* \*